United States Patent
Tamura et al.

(10) Patent No.: US 10,050,160 B2
(45) Date of Patent: Aug. 14, 2018

(54) CU—GA TARGET, METHOD OF PRODUCING SAME, LIGHT-ABSORBING LAYER FORMED FROM CU—GA BASED ALLOY FILM, AND CIGS SYSTEM SOLAR CELL HAVING THE LIGHT-ABSORBING LAYER

(75) Inventors: Tomoya Tamura, Ibaraki (JP); Hiroyoshi Yamamoto, Ibaraki (JP); Masaru Sakamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1027 days.

(21) Appl. No.: 13/988,363

(22) PCT Filed: Aug. 10, 2011

(86) PCT No.: PCT/JP2011/068235
§ 371 (c)(1),
(2), (4) Date: Aug. 21, 2013

(87) PCT Pub. No.: WO2012/098722
PCT Pub. Date: Jul. 26, 2012

(65) Prior Publication Data
US 2013/0319527 A1    Dec. 5, 2013

(30) Foreign Application Priority Data
Jan. 17, 2011  (JP) ................. 2011-006778

(51) Int. Cl.
*H01L 31/0272*  (2006.01)
*B22F 3/14*  (2006.01)
(Continued)

(52) U.S. Cl.
CPC ............ *H01L 31/0272* (2013.01); *B22F 3/14* (2013.01); *C22C 1/0425* (2013.01); *C22C 9/00* (2013.01);
(Continued)

(58) Field of Classification Search
CPC .......... B22F 3/14; B22F 2998/10; B22F 9/04; C22C 9/00; C22C 28/00; C22C 1/0425;
(Continued)

(56) References Cited

U.S. PATENT DOCUMENTS

| 7,018,858 B2 | 3/2006 | Aoki et al. |
| 2005/0028861 A1* | 2/2005 | Aoki ................... H01L 31/0322 136/256 |

(Continued)

FOREIGN PATENT DOCUMENTS

| JP | 2000-073163 A | 3/2000 |
| JP | 2008-138232 A | 6/2008 |

(Continued)

OTHER PUBLICATIONS

JP 2011-149039 A Online Machine Translation, Translated on Jun. 26, 2016.*

(Continued)

*Primary Examiner* — Golam Mowla
(74) *Attorney, Agent, or Firm* — Howson & Howson LLP

(57) ABSTRACT

A Cu—Ga alloy sintered-compact sputtering target having a Ga concentration of 40 to 50 at % and Cu as the balance, wherein the sintered-compact sputtering target is characterized in that the relative density is 80% or higher, and the compositional deviation of the Ga concentration is within ±0.5 at % of the intended composition. A method of producing a Cu—Ga alloy sintered-compact sputtering target having a Ga concentration of 40 to 50 at % and Cu as the balance, wherein the method thereof is characterized in that Cu and Ga raw materials are melted and cooled/pulverized to produce a Cu—Ga alloy raw material powder, and the obtained material powder is further hot-pressed with a retention temperature being between the melting point of the mixed raw material powder and a temperature 15° C. lower (Continued)

Casting method (Ga 47 at%)    Powder method (Ga 47 at%)

γ  : γ phase
θ  : θ phase
Ga : Ga phase than the melting point and with a pressure of 400 kgf/cm² or more applied to the sintered mixed raw material powder. Provided are a sputtering target having very low compositional deviation and high density; a method of producing the target; a light-absorbing layer having a Cu—Ga based alloy film; and a CIGS solar cell including the light-absorbing layer.

5 Claims, 1 Drawing Sheet

(51) Int. Cl.
| | |
|---|---|
| *C22C 9/00* | (2006.01) |
| *C22C 28/00* | (2006.01) |
| *C23C 14/34* | (2006.01) |
| *H01L 31/032* | (2006.01) |
| *H01L 31/18* | (2006.01) |
| *C22C 1/04* | (2006.01) |
| *B22F 9/04* | (2006.01) |

(52) U.S. Cl.
CPC .......... *C22C 28/00* (2013.01); *C23C 14/3414* (2013.01); *H01L 31/0322* (2013.01); *H01L 31/18* (2013.01); *B22F 9/04* (2013.01); *B22F 2998/10* (2013.01); *Y02E 10/541* (2013.01); *Y02P 70/521* (2015.11)

(58) Field of Classification Search
CPC ............ C23C 14/3414; C23C 14/0322; H01L 31/0322; H01L 31/18; H01L 31/0272; Y02E 10/541; Y02P 70/521
See application file for complete search history.

(56) References Cited

U.S. PATENT DOCUMENTS

| | | |
|---|---|---|
| 2010/0307914 A1 | 12/2010 | Hiramato et al. |
| 2011/0284372 A1 | 11/2011 | Hiramato et al. |
| 2012/0045360 A1 | 2/2012 | Matsumura et al. |
| 2012/0205242 A1 | 8/2012 | Tamura et al. |
| 2013/0168241 A1 | 7/2013 | Tamura et al. |
| 2014/0001039 A1 | 1/2014 | Tamura et al. |

FOREIGN PATENT DOCUMENTS

| | | |
|---|---|---|
| JP | 2008-163367 A | 7/2008 |
| JP | 2009-120863 A | 6/2009 |
| JP | 2011-149039 A | 8/2011 |
| TW | 201012954 A | 4/2010 |
| WO | 2009/123059 A1 | 10/2009 |
| WO | 2011/001974 A1 | 1/2011 |
| WO | 2011/010529 A1 | 1/2011 |

OTHER PUBLICATIONS

JP 2008-138232 A online machine translation as provided by Patent Translate Powered by EPO and Google, Translated on Jan. 5, 2017.*
P.R. Subramanian et al.,"Cu—Ga(Copper-Gallium)", Phase Diagrams of Binary Copper Alloys, ASM International, pp. 174-184, Nov. 1994.

* cited by examiner

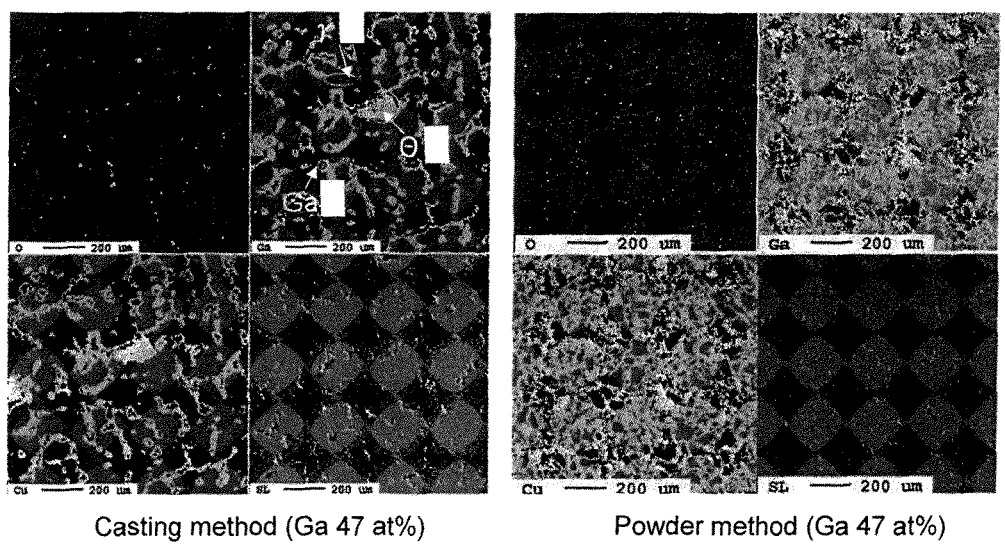
Casting method (Ga 47 at%)  Powder method (Ga 47 at%)
γ : γ phase
θ : θ phase
Ga : Ga phase

CU—GA TARGET, METHOD OF PRODUCING SAME, LIGHT-ABSORBING LAYER FORMED FROM CU—GA BASED ALLOY FILM, AND CIGS SYSTEM SOLAR CELL HAVING THE LIGHT-ABSORBING LAYER

BACKGROUND

The present invention relates to a Cu—Ga alloy sputtering target that is used for forming a Cu—In—Ga—Se (hereinafter, referred to as CIGS) quaternary system alloy thin film, which is a light-absorbing layer of a thin-film solar cell layer, a method of producing the target, a light-absorbing layer formed from a Cu—Ga based alloy film, and CIGS system solar cell having the light-absorbing layer.

Recently, mass production of a CIGS system solar cell showing a high efficiency as a thin-film based solar cell has been promoted. An evaporation method and a selenization method are known as methods of producing the light-absorbing layer of the CIGS solar cell. The production of solar cells by the evaporation method has an advantage of high conversion efficiency, but has disadvantages of a low deposition rate, a high cost, and a low productivity. Thus, the selenization method is better for industrial mass production.

The outline of the process of the selenization method is as follows. First, a molybdenum electrode layer is formed on a soda-lime glass substrate, and a Cu—Ga layer and an In layer are formed thereon by sputtering, followed by high temperature treatment in a selenium hydride gas to form a CIGS layer. A Cu—Ga target is used in the sputtering of the Cu—Ga layer in the process of forming the CIGS layer by the selenization method.

The conversion efficiency of a CIGS system solar cell is affected not only by various production conditions and characteristics of the constituent materials and the like, but also by the characteristics of the CIGS film to a great extent.

A melting method and a powder method are known as methods of producing the Cu—Ga target. In general, though the Cu—Ga target produced by the melting method contains relatively less impurities, the method has many disadvantages. For example, compositional segregation largely proceeds because a high cooling rate cannot be employed and thereby the composition of the film formed by the sputtering is gradually changed.

In addition, shrinkage cavities tend to occur at the final stage of cooling of the melted metal. The portions surrounding shrinkage cavities have inferior characteristics, and therefore the Cu—Ga targets having shrinkage cavities are unsuitable for processing into a predetermined shape and are not used, resulting in a reduction in yield.

Further, an increase in Ga concentration increases the brittleness and tends to cause cracking, which means that cracking and chipping readily occur during processing into a target or sputtering. This is also a cause of cost increase due to a reduction in yield. Thus, the production of the Cu—Ga target by the melting method is inadequate from the points of cost and characteristics.

A prior document (Patent Literature 1) relating to a Cu—Ga target produced by a melting method describes that compositional segregation is not observed, however, any analytical result is not shown at all. Also, though the document describes that no brittleness is caused and also no cracking is confirmed, it fails to show the processing conditions and sputtering conditions, and the details are unclear. And the examples only show the results of a Ga concentration range of which upper limit is 30 wt %, and characteristics including brittleness and cracking in a Ga concentration range higher than this upper limit are not described at all.

Meanwhile, the target produced by the powder method generally has disadvantages of a low sintering density and a high impurity concentration, for example. Patent Literature 2 relating to a Cu—Ga target describes about a sintered compact target, wherein brittleness in conventional technology, i.e., tendency of occurrence of cracking and chipping during cutting out of targets, is described, and this problem is solved by sintering a mixture of two types of powder.

One of the two types of powder is a powder containing Ga in a high content, and the other is a powder containing Ga in a low content. The powders generate a two-phase coexisting structure surrounding a grain boundary phase.

This process includes production of two types of powder and is therefore complicated. In addition, since the powders have different physical properties such as hardness and textures, it is difficult to obtain a uniform sintered compact by simply mixing and sintering only, and an improvement in relative density cannot be expected.

A target having low density obviously causes abnormal discharge and generation of particles. Deformed materials such as particles present on a sputtering film surface adversely affect the characteristics of the subsequently formed CIGS film and may ultimately cause a considerable reduction in the conversion efficiency of the CIGS solar cell with high probability.

Patent Literature 1: Japanese Patent Application Laid-Open Publication No. 2000-73163

Patent Literature 2: Japanese Patent Application Laid-Open Publication No. 2008-138232

SUMMARY OF THE INVENTION

Technical Problem

A Cu—Ga alloy including 40 at % or more of Ga and balance of Cu produced by melting/casting has a two-phase coexisting structure composed of a γ phase and a θ phase, and Ga segregates in the θ phase. The segregated Ga leaches from the ingot surface at room temperature, which causes a problem that the alloy cannot be used as a sputtering target.

In order to solve this problem, a sintering method is proposed as a method of producing a Cu—Ga alloy sputtering target. That is, an ingot having Ga segregation is totally pulverized and is sintered via a hot-press. As a result, the problem of Ga segregation is solved, and thereby the problems of leaching and compositional deviation are solved.

However, the Cu—Ga alloy sputtering target produced by the sintering method has low density, and thereby the surface is roughened in processing of the target surface. In consideration of these problems, an object of the present invention is to provide a sputtering target having significantly less compositional deviation and high density, a method of producing the target, a light-absorbing layer formed from a Cu—Ga based alloy film, and a CIGS system solar cell including the light-absorbing layer.

Solution to Problem

In order to solve the above-mentioned problems, the present inventors have diligently studied and, as a result, have found that a sintering method can provide a Cu—Ga alloy sputtering target having reduced compositional deviation and high density and have completed the present invention.

Based on the above-mentioned findings, the present invention provides:

1) A Cu—Ga alloy sintered compact sputtering target having a Ga concentration of 40 to 50 at % and Cu as the balance, wherein the relative density is 80% or higher, and the compositional deviation of the Ga concentration is within ±0.5 at % of the intended composition; and
2) The Cu—Ga alloy sintered compact sputtering target according to 1) above, wherein the target is produced by hot-pressing a pulverized raw material mixture prepared by melting and cooling Cu and Ga raw materials.

The present invention also provides:

3) A method of producing a Cu—Ga based alloy sintered compact sputtering target having a Ga concentration of 40 to 50 at % and Cu as the balance, the method comprising:
producing a Cu—Ga alloy raw material powder by melting, cooling and pulverizing Cu and Ga raw materials; and
hot-pressing the raw material powder at a retention temperature being between the melting point of the mixed raw material powder and a temperature 15° C. lower than the melting point and with a pressure of 400 kgf/cm$^2$ or more applied to the sintering mixed raw material powder.

The present invention also provides:

4) The method of producing a Cu—Ga alloy sintered compact sputtering target according to 3) above, wherein the relative density is 80% or higher; and
5) The method of producing a Cu—Ga alloy sintered compact sputtering target according to 3) or 4) above, wherein the compositional deviation of the Ga concentration is within ±0.5 at % of the intended composition.

The present invention also provides:

6) A light-absorbing layer comprising a Cu—Ga based alloy film formed on a substrate using the Cu—Ga alloy sintered compact sputtering target according to 1) or 2) above; and
7) A CIGS system solar cell including the light-absorbing layer according to 6) above.

According to the present invention, a Cu—Ga alloy sintered compact target having significantly less compositional deviation and high density can be produced, and a light-absorbing layer and CIGS system solar cell formed from a Cu—Ga based alloy film can be produced using the Cu—Ga alloy sintered compact sputtering target. Thus, the present invention has excellent effects of preventing the reduction of conversion efficiency of the CIGS solar cell and achieving a low cost production of the CIGS system solar cell.

BRIEF DESCRIPTION OF DRAWING

FIG. 1 shows the results of electron probe microanalysis (EPMA) of surfaces of targets prepared in Comparative Example 5 (casting method) and Example (powder sintering method).

DETAILED DESCRIPTION OF THE INVENTION

The definitions of constituent elements, the reasons and meanings of range regulations, the preparation methods, measuring methods or the like of the present invention are now be described.

In the Cu—Ga alloy sintered compact of the present invention, the Ga concentration range is 40 to 50 at %, and the balance is Cu. This Ga concentration range is determined based on that in a Ga concentration of higher than 50 at %, a part of the Ga remains in the liquid phase after synthesis to make production of an alloy powder difficult. In contrast, though the θ phase is formed by a Ga concentration of 42.6% in the phase diagram, in actual production, the presence of a θ phase is confirmed even in a Cu—Ga alloy having a Ga concentration of 40.0 at %.

This Ga concentration range was determined so as to correspond to the purpose of the present invention of increasing the density of the Cu—Ga alloy sintered compact in the compositional range where the θ phase is present.

In addition, this Ga concentration range also coincides with the Ga concentration range more suitable for raising the conversion efficiency of an actually produced CIGS system solar cell than the current level. However, it is also possible to apply the technical idea itself of the present invention to compositions beyond this range.

In the Cu—Ga alloy sintered compact target and the production of a light-absorbing layer and CIGS system solar cell formed from a Cu—Ga based alloy film using the Cu—Ga alloy sintered compact sputtering target, the major problem is compositional deviation. The compositional deviation causes large changes in the characteristics of the light-absorbing layer and the CIGS system solar cell.

In spite of the fact that the Cu—Ga alloy sputtering target of the present invention is a sintered compact, it is possible to control the compositional deviation of the Ga concentration within ±0.5 at % with respect to the intended (targeted) composition. This can be achieved by the present invention and is a main characteristic of the present invention.

The compositional deviation of the Ga concentration in this case, i.e., the "compositional deviation" from the intended (targeted) Ga concentration, is specifically a difference between the Ga concentrations (expressed as at %) of the charged composition and the produced target. The difference is controlled within ±0.5 at %.

The Cu—Ga alloy sintered compact sputtering target of the present invention has a relative density of 80% or higher. The relative density is a ratio obtained by dividing the actual absolute density of a target by the theoretical density of a target having the same composition. The relative density of the target being low means the followings; splashes tends to occur that are originated from the peripheries of holes when the inner holes come out during sputtering, particles due to abnormal discharge tends to occur on a film, and the progress of surface unevenness promptly proceeds to readily cause abnormal discharge and the like originating from surface protrusions (nodules).

Accordingly, a relative density of 80% or higher is necessary. If the relative density is not less than 80%, the occurrence of particles is not a severe problem.

The present invention provides a Cu—Ga alloy sintered compact sputtering target composed of a single composition as described above. The term "single composition" in the present invention refers to a composition where common physical means cannot detect the presence of any composition other than the composition.

In addition, even if the composition contains another composition in a micro level, as long as various characteristics are not adversely affected, substantially the same effects as those of a single composition are obtained. Thus, as long as the characteristics of the present invention are not changed, the composition may optionally be added other materials without any problem.

The method of producing the target, the reasons and meanings of range regulations, the affects thereof on the various characteristics of the target, etc. of the present invention will now be described.

Cu and Ga raw materials are weighed at a predetermined composition ratio, within a Ga concentration range of 40 to 50%. In order to reduce the metal impurity concentration of a finally obtained Cu—Ga target as much as possible, for example, to less than 10 ppm, it is necessary to use high-purity materials each having a purity of 5 N or more.

The weighed raw materials are placed in a carbon crucible and are heated in a heating furnace under about 0.5 MPa argon atmosphere at a typical rate of temperature-increase, for example, 10° C./min and are melted at 1050° C. The melted materials are cooled at a cooling rate of 5 to 10° C./min, and the resulting synthetic raw material is taken out. Subsequently, this synthetic raw material is pulverized. The pulverized raw material is passed through a sieve of 150 mesh for particle size control to give a powder having a particle size of, for example, 90 µm or less.

Compositional deviation in melting/casting is caused by that Ga segregated inside a θ phase easily comes out by leaching from the ingot surface and thereby the compositional deviation occurs. In also the powder sintering method of the present invention also, the same phenomenon is likely to occur since the raw material powder is produced from the casting ingot.

However, in the process of the present invention, the segregated Ga is also pulverized simultaneously to generate a state that Ga coats the powder surfaces of the γ phase and θ phase compositions pulverized on this occasion. The Ga disappears in the subsequent alloying reaction due to the application of heat and pressure in the hot-pressing (HP).

As a result, the compositional deviation of the sintered compact is significantly reduced. This brings in a notable effect of significantly reducing the compositional deviation, in the present invention.

Subsequently, hot-pressing is performed. The retention temperature in the hot-pressing is set between the melting point of the mixed raw material powder and a temperature 15° C. lower than the melting point, and sintering is performed at a retention time of 1 to 3 hours, a cooling rate of 5° C./min or more, and applying a pressure of 400 kgf/cm² or more to the sintering mixed raw material powder. If the pressure is lower than this, the density of the sintered compact is not sufficiently increased. In contrast, applying a pressure tremendously needs an expensive apparatus which is unnecessary but shows little merits; desirably, the upper limit is about 800 kgf/cm² with the sintered compact density being considered.

In the present invention, the hot-pressing is performed under a temperature condition of just below the melting point, as described above. In the case of a Cu—Ga alloy having a Ga concentration of 40 to 50 at % and Cu as the balance, the sintering is performed at a very low temperature, that is, as shown in Examples, at a very low temperature of 240° C.

Such a low sintering temperature is generally very difficult to control and easily causes overshoot. Thus, though a trial to a temperature about 30° C. lower than the melting point may be performed, actual sintering is not performed. The present invention has notable characteristics in such a manufacturing process.

For the Cu—Ga sintered compact produced by the above-described method, the density can be determined by an Archimedes method, the average particle diameter can be determined by planimetry after surface etching, the impurity concentration can be determined by glow discharge mass spectrometry (GDMS), and the composition and the presence and degree of another composition can be determined by an X-ray diffraction method.

EXAMPLES

Example 1

Cu and Ga raw materials were weighed such that the composition ratio of Ga concentration was 47 at % (charged Ga concentration: 47 at %), i.e., in the range of Ga concentration of 40 to 50 at %. Subsequently, weighed raw materials were placed in a carbon crucible, heated in a heating furnace under an argon pressure of about 5 kgf/cm² at a temperature-increase rate of 10° C./min and melted at 1050° C. The melted materials were cooled at a cooling rate of 5 to 10° C./min, and the resulting synthetic raw material was taken out. Subsequently, this synthetic raw material was pulverized and was passed through a sieve of 150 mesh for particle size control to give a powder having a particle size of 90 µm or less.

Subsequently, the obtained powder was placed in a pressure sintering furnace and was heated at a temperature-increase rate of 3° C./min from room temperature to 240° C. and maintained at 240° C. for 2.5 hours and was then naturally cooled in the furnace by stopping the heating. The pressure application was started 30 minutes after the temperature reached 240° C. and bearing a pressure of 400 kgf/cm² was added until 30 minutes after the stoppage of the heating, i.e., for 2.5 hours.

Compositional Deviation

Table 1 shows the analytical results of the composition prepared in Example 1 (powder sintering method). It was confirmed that in the target prepared in Example 1 (powder sintering method), only a little deviation of 0.3 at % occurred. This result demonstrates that the deviation is within an analytical error, i.e., considerably low.

TABLE 1

|  |  | Cu | Ga |
|---|---|---|---|
| Example 1 | Weighed value (at %) | 53.0 | 47.0 |
| (powder sintering) | Analysis value (at %) | 53.3 | 46.7 |
| Comparative Example 5 | Weighed value (at %) | 53.0 | 47.0 |
| (casting) | Analysis value (at %) | 54.4 | 45.6 |

As described above, though the raw material powder is produced from the casting ingot in also the powder sintering method, the segregated Ga is also pulverized simultaneously to generate a state that Ga coats the powder surfaces of the γ phase and θ phase compositions pulverized. The Ga disappears in the subsequent alloying reaction due to the application of heat and pressure in the hot-pressing (HP). As a result, leaching of Ga did not occur. This is shown in the right in FIG. 1, as the results of EPMA of the sintered compact surface. In addition, the target had a Ga concentration of 46.7 at % of which "compositional deviation" from the charged Ga concentration of 47 at % was 0.3 at %. Thus, it was confirmed that the compositional deviation was very low.

Change in Density

Table 2 shows the results, such as density, in Example 1 where the hot-pressing was performed under the above-mentioned conditions, namely, temperature of 240° C. and bearing a pressure of 400 kgf/cm².

As shown in Table 2, the sintering density was 6.23 g/cm³, and the relative density was 80.9%. As a result, leaching of Ga did not occur, and roughening did not occur in the surface processing into a target. Such a density of 80% or higher allows a machining plane to have metallic surface.

concentration of 44 at % was 0.4 at %. Thus, it was confirmed that the compositional deviation was very low.

Change in Density

Table 2 shows the results, such as density, in Example 2 where the hot-pressing was performed under the above-

TABLE 2

| Example/Comparative Example | Charged Ga concentration (at %) | Retention temperature (° C.) | Contact pressure (kgf/cm²) | Density (g/cm³) | Relative density (%) | Ga liquid phase leaching | Roughness after processing | Target Ga concentration | Compositional deviation of Ga concentration |
|---|---|---|---|---|---|---|---|---|---|
| Example 1 | 47 | 240 | 400 | 6.23 | 80.9 | No | No | 46.7 | −0.3 |
| Example 2 | 44 | 240 | 400 | 6.36 | 80.5 | No | No | 43.6 | −0.4 |
| Example 3 | 40 | 240 | 400 | 6.48 | 81.0 | No | No | 39.8 | −0.2 |
| Comparative Example 1 | 47 | 200 | 400 | 5.76 | 74.8 | No | Yes | — | — |
| Comparative Example 2 | 47 | 240 | 150 | 5.65 | 73.4 | No | Yes | — | — |
| Comparative Example 3 | 47 | 260 | 400 | 7.47 | 97.0 | Yes | — | — | — |
| Comparative Example 4 | 60 | 240 | 400 | — | — | Yes | — | — | — |
| Comparative Example 5 | 47 | Produced by casting method | | | | | | 45.6 | −1.4 |

Example 2

Cu and Ga raw materials were weighed such that the composition ratio of Ga concentration was 44 at % (charged Ga concentration: 44 at %), i.e., in the range of Ga concentration of 40 to 50 at %. Subsequently, weighed raw materials were placed in a carbon crucible and were heated in a heating furnace under an argon pressure of about 5 kgf/cm² at a temperature-increase rate of 10° C./min and were melted at 1050° C. The melted materials were cooled at a cooling rate of 5 to 10° C./min, and the resulting synthetic raw material was taken out. Subsequently, this synthetic raw material was pulverized and was passed through a sieve of 150 mesh for particle size control to give a powder having a particle size of 90 µm or less.

Subsequently, the obtained powder was placed in a pressure sintering furnace and was heated at a temperature-increase rate of 3° C./min from room temperature to 240° C. and maintained at 240° C. for 2.5 hours and was then naturally cooled in the furnace by stopping the heating. The pressure application was started 30 minutes after the temperature reached 240° C. and bearing a pressure of 400 kgf/cm² was added until 30 minutes after the stoppage of the heating, i.e., for 2.5 hours.

Compositional Deviation

Table 1 shows the analytical results of the composition prepared in Example 2 (powder sintering method). It was confirmed that in the target prepared in Example 2 (powder sintering method), only a little deviation of 0.4 at % occurred. This result demonstrates that the deviation is within an analytical error, i.e., considerably low.

As described above, though the raw material powder is produced from the casting ingot in also the powder sintering method, the segregated Ga is also pulverized simultaneously to generate a state that Ga coats the powder surfaces of the γ phase and θ phase compositions pulverized. The Ga disappears in the subsequent alloying reaction due to the application of heat and pressure in the hot-pressing (HP). As a result, leaching of Ga did not occur. Thus, the same results as those of EPMA of the sintered compact surface in Example 1 shown in the right in FIG. 1 were obtained.

In addition, the target had a Ga concentration of 43.6 at % of which "compositional deviation" from the charged Ga mentioned conditions, namely, a temperature of 240° C. and bearing a pressure of 400 kgf/cm². As shown in Table 2, the sintering density was 6.36 g/cm³, and the relative density was 80.5%. As a result, leaching of Ga did not occur, and roughening did not occur in the surface processing into a target. Such a density of 80% or higher allows a machining plane to have metallic surface.

Example 3

Cu and Ga raw materials were weighed such that the composition ratio of Ga concentration was 44 at % (charged Ga concentration: 44 at %), i.e., in the range of Ga concentration of 40 to 50 at %. Subsequently, weighed raw materials were placed in a carbon crucible and were heated in a heating furnace under an argon pressure of about 5 kgf/cm² at a temperature-increase rate of 10° C./min and were melted at 1050° C. The melted materials were cooled at a cooling rate of 5 to 10° C./min, and the resulting synthetic raw material was taken out. Subsequently, this synthetic raw material was pulverized and was passed through a sieve of 150 mesh for particle size control to give a powder having a particle size of 90 µm or less.

Subsequently, the obtained powder was placed in a pressure sintering furnace and was heated at a temperature-increase rate of 3° C./min from room temperature to 240° C. and maintained at 240° C. for 2.5 hours and was then naturally cooled in the furnace by stopping the heating. The pressure application was started 30 minutes after the temperature reached 240° C. and bearing a pressure of 400 kgf/cm² was added until 30 minutes after the stoppage of the heating, i.e., for 2.5 hours.

Compositional Deviation

Table 1 shows the analytical results of the composition prepared in Example 3 (powder sintering method). It was confirmed that only a little deviation of 0.2 at % occurred in the target prepared in Example 3 (powder sintering method). This result demonstrates that the deviation is within an analytical error, considerably low.

As described above, the raw material powder is produced from the casting ingot in also the powder sintering method, the segregated Ga is also pulverized simultaneously to generate a state that Ga coats the powder surfaces of the γ phase and θ phase compositions pulverized. The Ga disappears in the subsequent alloying reaction due to the application of heat and pressure in the hot-pressing (HP). As a result, leaching of Ga did not occur. Thus, the same results as those of EPMA of the sintered compact surface in Example 1 shown in the right in FIG. 1 were obtained.

In addition, the target had a Ga concentration of 39.8 at % of which "compositional deviation" from the charged Ga concentration of 40 at % was 0.2 at %. Thus, it was confirmed that the compositional deviation was very low.

Change in Density

Table 2 shows the results, such as density, in Example 3 where the hot-pressing was performed under the above-mentioned conditions, namely, a temperature of 240° C. and bearing a pressure of 400 kgf/cm². As shown in Table 2, the sintering density was 6.48 g/cm³, and the relative density was 81.0%. As a result, leaching of Ga did not occur, and roughening did not occur in the surface processing into a target. Such a density of 80% or higher allows a machining plane to have metallic surface.

Comparative Example 1

In Comparative Example 1, a powder produced under the same conditions as those in Example 1 was hot-pressed at a sintering temperature of 200° C. and bearing a pressure of 400 kgf/cm² to obtain a target. The results, such as density, of this target are shown in Table 2. As shown in Table 2, the sintering density was 5.76 g/cm³, and the relative density was 74.8%. Though Ga did not leach, roughening occurred in the surface processing into a target. As a result, finishing a machining plane to have metallic surface was impossible. This was believed to be caused by the low sintering temperature of 200° C.

Comparative Example 2

In Comparative Example 2, a powder produced under the same conditions as those in Example 1 was hot-pressed at a temperature of 240° C. and bearing a pressure of 150 kgf/cm² to obtain a target. The results such as density of this target are shown in Table 2. As shown in Table 2, the sintering density was 5.65 g/cm³, and the relative density was 73.4%.

Though Ga did not leach, roughening occurred in the surface processing into a target. As a result, finishing a machining plane to have metallic surface was impossible. This was believed to be caused by bearing the low pressure of 150 kgf/cm².

Comparative Example 3

In Comparative Example 3, a powder produced under the same conditions as those in Example 1 was hot-pressed at a temperature of 260° C. and bearing a pressure of 400 kgf/cm². The results such as density are shown in Table 2. As shown in Table 2, the sintering density was 7.47 g/cm³, and the relative density was 97.0%. However, leaching of Ga occurred. As a result, compositional deviation was caused to show that the sintering at high temperature (temperature: 260° C.) is not preferred.

Comparative Example 4

In Comparative Example 4, a powder produced under the same conditions as those in Example 1 except that the charged Ga concentration was 60 at % was hot-pressed at a temperature of 240° C. and bearing a pressure of 400 kgf/cm². The results of observation of Ga phase leaching are shown in Table 2. As shown in Table 2, leaching of Ga occurred.

Comparative Example 5

In Comparative Example 5, a target was produced by melting and casting Cu and Ga raw materials having the same composition as that in Example 1. In the casting of Comparative Example 5, the compositional deviation with respect to the weighed amount was 1 at % or more. The cause of the compositional deviation is segregation of Ga observed inside the θ phase during the casting, as shown in the results of EPMA in FIG. 1. The segregated Ga easily comes out by leaching from the ingot surface, which is believed to cause the compositional deviation.

It can be confirmed from the above-described Examples and Comparative Examples that a sintered compact is effective as the Cu—Ga alloy sputtering target and that a target having an increased density, a controlled Ga concentration, and showing less compositional deviation is effective.

According to the present invention, a Cu—Ga alloy sintered compact sputtering target having significantly low compositional deviation and high density can be produced, and thereby the surface conditions during the processing are improved and sputtering can be performed without causing arcing and cracking. In addition, the present invention has excellent effects for preventing the reduction of conversion efficiency of the CIGS system solar cell and achieving a low cost production of the CIGS solar cell. Thus, the present invention prevents the reduction of conversion efficiency of a CIGS solar cell and is therefore useful for a solar cell.

The invention claimed is:

1. A Cu—Ga alloy sintered compact sputtering target having a structure consisting of a single composition alloy having a Ga concentration of 40 to 50 at % and Cu as the balance, wherein the relative density is 80% or higher, and no Ga phase is present.

2. A method of producing a Cu—Ga based alloy sintered compact sputtering target having a structure consisting of a single composition alloy having a Ga concentration of 40 to 50 at % and Cu as the balance, a relative density of 80% or higher, and no Ga phase present within the sputtering target, comprising the steps of:
producing a Cu—Ga alloy raw material powder by melting, cooling and pulverizing Cu and Ga raw materials; and
hot-pressing the raw material powder at a retention temperature being between the melting point of the mixed raw material powder and a temperature 15° C. lower than the melting point and with a pressure of 400 kgf/cm² or more applied to the sintering mixed raw material powder.

3. A light-absorbing layer comprising a Cu—Ga based alloy film formed on a substrate using the Cu—Ga alloy sintered compact sputtering target according to claim 1.

4. A CIGS system solar cell comprising the light-absorbing layer according to claim 3.

5. The method according to claim 2, wherein compositional deviation of the Ga concentration is within ±0.5 at % of the intended composition.

* * * * *